US010324126B2

(12) United States Patent  
Cheung et al.

(10) Patent No.: US 10,324,126 B2  
(45) Date of Patent: Jun. 18, 2019

(54) METHOD AND APPARATUS FOR ALIGNING PROBE PINS WITH RESPECT TO POSITIONS OF ELECTRONIC DEVICES

(71) Applicant: ASM Technology Singapore Pte Ltd, Singapore (SG)

(72) Inventors: Yu Sze Cheung, N.T. (HK); Hon Kam Ng, Tsing Yi (HK); Chun Shing Yip, Tsing Yi (HK)

(73) Assignee: ASM TECHNOLOGY SINGAPORE PTE LTD., Singapore (SG)

( * ) Notice: Subject to any disclaimer, the term of this patent is extended or adjusted under 35 U.S.C. 154(b) by 12 days.

(21) Appl. No.: 15/178,956

(22) Filed: Jun. 10, 2016

(65) Prior Publication Data

US 2017/0356958 A1 Dec. 14, 2017

(51) Int. Cl.
*G06T 7/00* (2017.01)
*G06T 7/73* (2017.01)
*G01R 1/073* (2006.01)
*G01R 31/28* (2006.01)

(52) U.S. Cl.
CPC ..... *G01R 31/2891* (2013.01); *G01R 1/07364* (2013.01); *G06T 7/001* (2013.01); *G06T 7/74* (2017.01); *G06T 2207/30148* (2013.01); *G06T 2207/30204* (2013.01)

(58) Field of Classification Search
None
See application file for complete search history.

(56) References Cited

U.S. PATENT DOCUMENTS 5,644,245 A * 7/1997 Saitoh ............... G01R 1/06794
324/750.18

* cited by examiner

*Primary Examiner* — Paresh H Patel  
(74) *Attorney, Agent, or Firm* — Ostrolenk Faber LLP

(57) ABSTRACT

A method for aligning probe pins with respect to positions of electronic devices comprises conducting contact stamping on a first electronic device with the probe pins to form first probe marks on lead pads of the first electronic device, capturing an image of the first electronic device, determining positions of the first probe marks on the first electronic device using the captured image, calculating an offset using the positions of the first probe marks, adjusting relative positions between a subsequent plurality of electronic devices and the probe pins using the offset, and contacting lead pads of the subsequent plurality of electronic devices with the probe pins for testing said electronic devices. The first probe marks are configured to have greater visibility as compared with second probe marks formed when contacting the lead pads of the subsequent plurality of electronic devices with the probe pins, so as to improve the accuracy of the offset calculated.

15 Claims, 14 Drawing Sheets

METHOD AND APPARATUS FOR ALIGNING PROBE PINS WITH RESPECT TO POSITIONS OF ELECTRONIC DEVICES

FIELD OF THE INVENTION

The present invention relates to a method and apparatus for aligning probe pins with respect to positions of electronic devices for testing the electronic devices more effectively.

BACKGROUND OF THE INVENTION

FIGS. 1A and 1B respectively show a plan view and a perspective view of an exemplary electronic device 100. As shown in FIGS. 1A and 1B, the electronic device 100 comprises a plurality of electrical lead pads 102. These lead pads 102 are used for the connection of the electronic device 100 to other electronic components.

To check if an electronic device operates as desired, the electronic device is usually subjected to various tests after its fabrication. This is typically performed by probing lead pads of the electronic device. To elaborate, probe pins (or in other words, contact pins) are brought into contact with the lead pads of the electronic device to connect the device to a tester. The tester sends signals to the electronic device and analyzes the electronic device's responses to determine if the device is working properly. As the signals to the device and the responses from the device are relayed via the connections between the lead pads and the probe pins, it is important to ensure proper electrical contact between the lead pads and the probe pins.

Ideally, the probe pins should contact the centres of the respective lead pads. FIG. 2 shows such an ideal situation. In particular, FIG. 2 shows a plan view of an electronic device 200 having a plurality of probe marks 204 at the centres of respective lead pads 202. The probe marks 204 indicate positions of the probe pins when the probe pins are brought into contact with the lead pads 202. Indentations with a particular depth are formed by the probe pins, depending on the force at which the device 200 is urged against the probe pins, the material composition of the lead pads and/or the number of times such urging occurs.

In order to get as close to the ideal situation as possible, the positions of the probe pins may be adjusted during the testing process. Conventionally, this is done by determining the positions of the probe marks on the lead pads after testing each electronic device and based on this determination, adjusting the positions of the probe pins for the next electronic device. To elaborate, after testing an electronic device that is held on a turret of a test handler, a camera captures an image of the electronic device to try to detect the positions of the probe marks on the lead pads of the device. The difference between the positions of the probe marks and the centres of respective lead pads is then calculated and used to adjust the positions of the probe pins. The turret of the test handler then retrieves a next electronic device for testing using the adjusted positions of the probe pins. The afore-mentioned steps are repeated for each electronic device.

A problem with the above approach is that it is often difficult to detect accurately the positions of the probe marks from the image captured after testing the electronic device. This is due to "noise" in the captured image which may be caused by unrelated features and/or defects in the electronic device. In turn, a number of tests with the probe pins in less than ideal positions may have to be performed before the difference in the positions of the probe marks and the centres of respective lead pads can be accurately calculated. This therefore results in low yield as many electronic devices tested at the beginning of the testing process may be wrongly classified as defective.

To overcome the above problem, methods to reduce the noise in the captured images have been developed. One such method involves performing various operations on the captured image to obtain one or more inspection result images, each based on a unique image characteristic or a unique combination of image characteristics. Each inspection result image is then correlated with a reference image to determine which image characteristic or combination of image characteristics is likely to provide the necessary contrast. The image characteristic or combination of image characteristics most likely to provide the necessary contrast is then used for the processing and inspection of subsequent captured images. Although such a method may help increase the accuracy in determining the probe marks' positions, it is unlikely that it can sufficiently improve the production yield. This is because there are many potential sources of noise in each captured image and the captured images of a plurality of electronic devices can differ from one another by a non-negligible amount. Therefore, it is unlikely that the method described above can sufficiently compensate for the noise in all the captured images to the extent that the probe marks positions can be detected at a high enough accuracy for every image.

SUMMARY OF THE INVENTION

The present invention aims to provide a new and useful method and apparatus for aligning probe pins with respect to positions of electronic devices.

In general terms, the present invention proposes calculating an offset using a first electronic device and using the offset for a subsequent plurality of electronic devices. Both the first electronic device and the subsequent plurality of electronic devices are contacted with the probe pins, with the probe marks formed on the first electronic device being formed more visibly than the probe marks formed on the subsequent plurality of electronic devices.

Specifically, a first aspect of the present invention is a method for aligning probe pins with respect to positions of electronic devices, the method comprising: conducting contact stamping on a first electronic device with the probe pins to form first probe marks on lead pads of the first electronic device; capturing an image of the first electronic device; determining positions of the first probe marks on the first electronic device using the captured image; calculating an offset using the positions of the first probe marks; adjusting relative positions between a subsequent plurality of electronic devices and the probe pins using the offset; and contacting lead pads of the subsequent plurality of electronic devices with the probe pins for testing said electronic devices, the contacting of the lead pads of the subsequent plurality of electronic devices with the probe pins forming second probe marks, wherein the first probe marks formed during the contact stamping are configured to have greater visibility as compared with the second probe marks.

By forming probe marks having greater visibility on the first electronic device, the positions of the probe marks can be more accurately determined. In turn, the offset can be more accurately calculated, and the adjustment of the relative positions between the subsequent electronic devices and the probe pins can be more accurate. Hence, less of the subsequent electronic devices will be wrongly classified as defective and overall, a higher yield can be achieved. The setup time of the apparatus (corresponding to the time taken to obtain an accurate offset) can also be reduced. Further, unlike prior art methods, the method of the above-mentioned first aspect uses a constant offset for each subsequent electronic device instead of calculating an offset after contacting each device with the probe pins. This thus helps to improve the efficiency, thereby increasing the yield.

Preferably, the method further comprises the following steps prior to the step of conducting contact stamping on the first electronic device with the probe pins: retrieving the first electronic device with a handling member; and determining a position of the first electronic device relative to the handling member.

Also preferably, the step of adjusting the relative positions between the subsequent plurality of electronic devices and the probe pins using the offset comprises: retrieving a subsequent electronic device with the handling member; determining a position of the subsequent electronic device relative to the handling member; calculating a difference between the position of the subsequent electronic device relative to the handling member and the position of the first electronic device relative to the handling member; and adjusting the relative position between the subsequent electronic device and the probe pins using the offset and the calculated difference.

By taking into account the difference in positions of the first and subsequent electronic devices relative to the handling member, the adjustment of the relative positions between the subsequent electronic device and the probe pins can be more accurate. This is because the offset is calculated using the first electronic device but the handling member may retrieve the subsequent electronic device at a position different from the position of the first electronic device.

The step of adjusting the relative position between the subsequent electronic device and the probe pins may be conducted by an adjusting station that is integrated with a contactor station for testing the electronic device such that the adjusting station and the contactor station form a single station. This reduces the number of stations of the apparatus. In turn, the size of the apparatus is reduced, and the manufacturing and maintenance costs of the apparatus are lowered.

The step of adjusting the relative positions between the subsequent plurality of electronic devices and the probe pins using the offset may further comprise the step of adjusting positions of the probe pins using the single station. By adjusting the positions of the probe pins instead of the position of the electronic device, the handling member need not release the electronic device prior to the contact stamping process. This helps to increase the efficiency of the process.

Alternatively, the step of adjusting the relative position between the subsequent electronic device and the probe pins may be conducted by an adjusting station that is separate from a contactor station for testing the electronic device. The step of adjusting the relative positions between the subsequent plurality of electronic devices and the probe pins using the offset may be performed by the adjusting station with respect to the handling member prior to the contacting of the lead pads of the subsequent plurality of electronic devices with the probe pins.

The step of determining the position of the first electronic device relative to the handling member may comprise capturing an image of the first electronic device and determining the position using the captured image. This allows the position to be determined quickly using image processing techniques well known in the art.

The step of capturing the image of the first electronic device prior to the step of conducting contact stamping on the first electronic device with the probe pins and the step of capturing the image of the first electronic device after the step of conducting contact stamping on the first electronic device with the probe pins may be conducted using a single imaging station. This reduces the size of the apparatus and since such an apparatus comprises fewer stations, the manufacturing and maintenance costs of the apparatus can be reduced.

Alternatively, the step of capturing the image of the first electronic device prior to the step of conducting contact stamping on the first electronic device with the probe pins may be conducted using one imaging station and the step of capturing the image of the first electronic device after the step of conducting contact stamping on the first electronic device with the probe pins may be conducted using another imaging station. Having two separate imaging stations for the image capturing before and after the contact stamping can smoothen the process flow.

The method may further comprise adjusting a relative position between the first electronic device and the probe pins prior to the step of conducting contact stamping on the first electronic device with the probe pins. This can help reduce the distance between the probe pins and the centres of the respective lead pads during the contact stamping process, so that the probe marks formed are not too far from the centres of the lead pads. This in turn facilitates the detection of the probe marks from the captured image.

Calculating the offset may comprise determining differences in the positions of the first probe marks and centres of respective lead pads of the first electronic device the first probe marks are formed on. This helps to achieve as close to the ideal situation as possible later on when adjusting the relative positions between the subsequent electronic devices and the probe pins using the offset.

The first probe marks may be formed to have a first level of depth and the second probe marks may have a second level of depth, the second level of depth being less than the first level of depth. Forming deeper probe marks provides a straightforward way of increasing the visibility of the first probe marks.

Conducting contact stamping on the first electronic device with the probe pins to form the first probe marks having the first level of depth may comprise stamping the first electronic device with the probe pins multiple times. This provides a straightforward way of forming deeper probe marks which are more visible in the subsequently captured image of the device.

The step of adjusting the relative positions between the subsequent plurality of electronic devices and the probe pins using the offset may be conducted manually using an adjusting station including a gauge configured to facilitate manual adjustment of positions of the electronic devices or the probe pins. This allows the user to perform manual adjustment of the positions of the devices or the probe pins more accurately.

A second aspect of the present invention is an apparatus for aligning probe pins with respect to positions of electronic devices, the apparatus comprising: a contactor station configured to conduct contact stamping on a first electronic device with the probe pins to form first probe marks on lead pads of the first electronic device and to contact lead pads of a subsequent plurality of electronic devices with the probe pins to conduct testing of the subsequent plurality of electronic devices with the probe pins, which testing forms second probe marks, the first probe marks formed during the contact stamping being configured to have greater visibility as compared with the second probe marks; an imaging station configured to capture an image of the first electronic device after the contact stamping of the first electronic device with the probe pins; a processing module configured to determine positions of the first probe marks on the first electronic device using the captured image and to calculate an offset using the positions of the first probe marks; and an adjusting station configured for adjusting relative positions between the subsequent plurality of electronic devices and the probe pins using the offset prior to the testing of the subsequent plurality of electronic devices with the probe pins.

BRIEF DESCRIPTION OF THE FIGURES

Embodiments of the invention will now be illustrated for the sake of example only with reference to the following drawings, in which.

DETAILED DESCRIPTION OF THE EMBODIMENTS

Figure 1A:
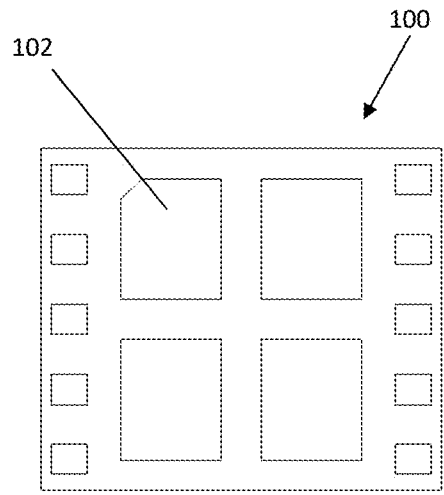
FIGS. 1A and 1B respectively show a plan view and a perspective view of an exemplary electronic device.
Figure 1B:
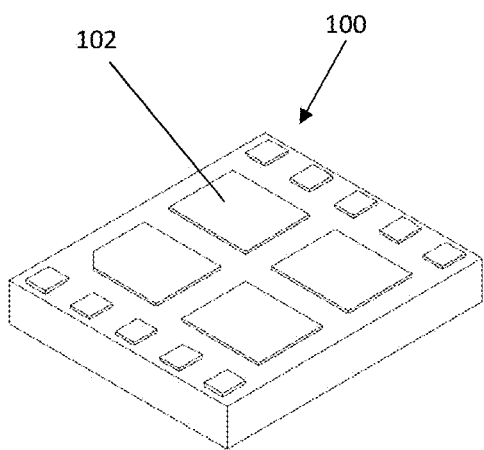
Figure 2:
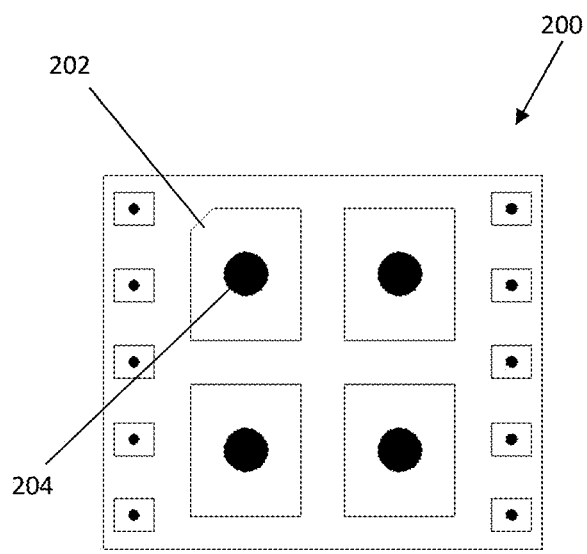
FIG. 2 shows an ideal situation in which probe marks coincide with centres of respective lead pads of an electronic device.
Figure 3:
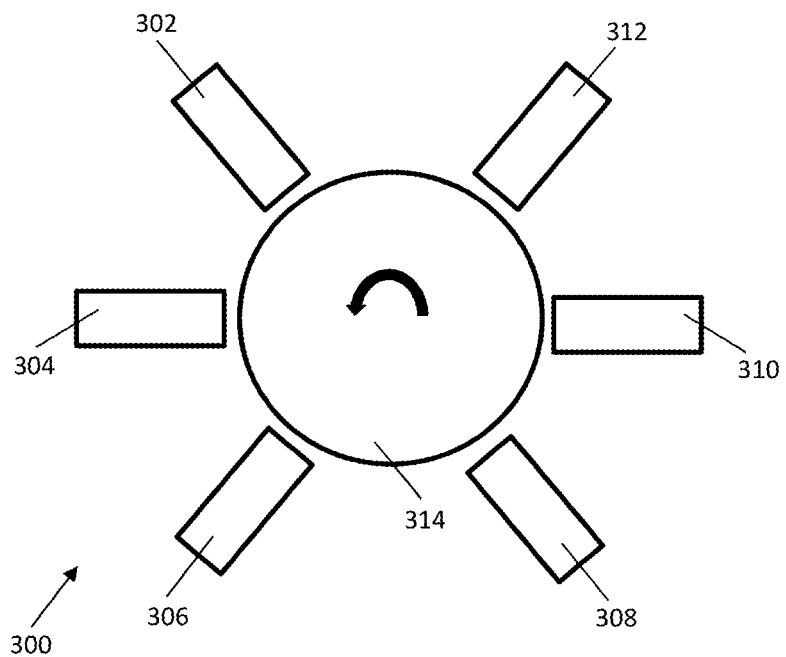
FIG. 3 shows an apparatus for aligning probe pins with respect to positions of electronic devices according to a first embodiment of the present invention.

FIG. 3 shows a plan view of an apparatus 300 for aligning probe pins with respect to positions of electronic devices according to a first embodiment of the present invention.

The apparatus 300 comprises a loading station 302 configured to receive electronic devices, first and second imaging stations 304, 310 configured to capture images of the electronic devices, an adjusting station 306 configured to adjust positions of the electronic devices relative to the probe pins, a contactor station 308 comprising the probe pins, an offloading station 312 configured to allow electronic devices to be offloaded from the apparatus 300 and a transfer member 314 configured to transfer the electronic devices between the stations 302-312. Although not shown in FIG. 3, the apparatus 300 further comprises a processing module in the form of a computer configured to process the captured images.

The transfer member 314 comprises a turret having a main circular body and multiple handling members in the form of electronic device holders arranged equidistantly along the circumference of the main circular body. Each electronic device holder is configured to carry an electronic device. The stations 302-312 are arranged around the main circular body and the main circular body is configured to rotate so as to transfer the electronic devices between the stations 302-312.

Figure 4A:
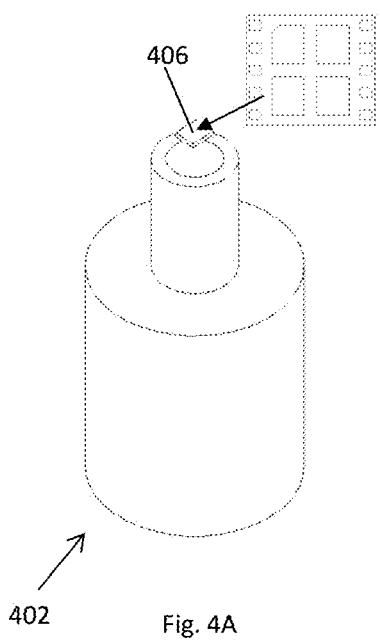
FIGS. 4A and 4B show perspective views of uplook cameras of the apparatus of FIG. 3.
Figure 4B:
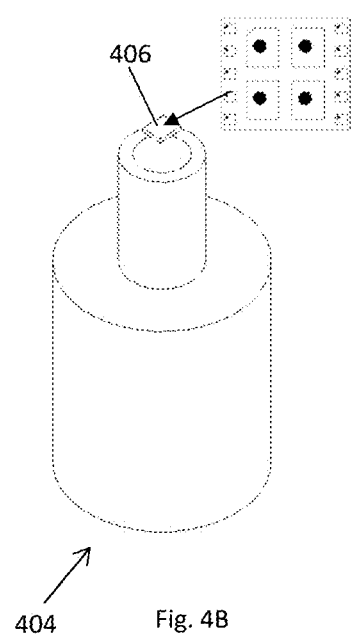

The first and second imaging stations 304, 310 each comprises an image capturing device in the form of an uplook camera. FIGS. 4A and 4B show perspective views of the uplook cameras 402, 404 of the first and second imaging stations 304, 310 respectively. As shown in FIGS. 4A and 4B, the uplook camera 402 of the first imaging station 304 serves to capture an image of the electronic device 406 before it is brought into contact with the probe pins, whereas the uplook camera 404 of the second imaging station 310 serves to capture an image of the electronic device 406 after it is brought into contact with the probe pins.

Figure 5:
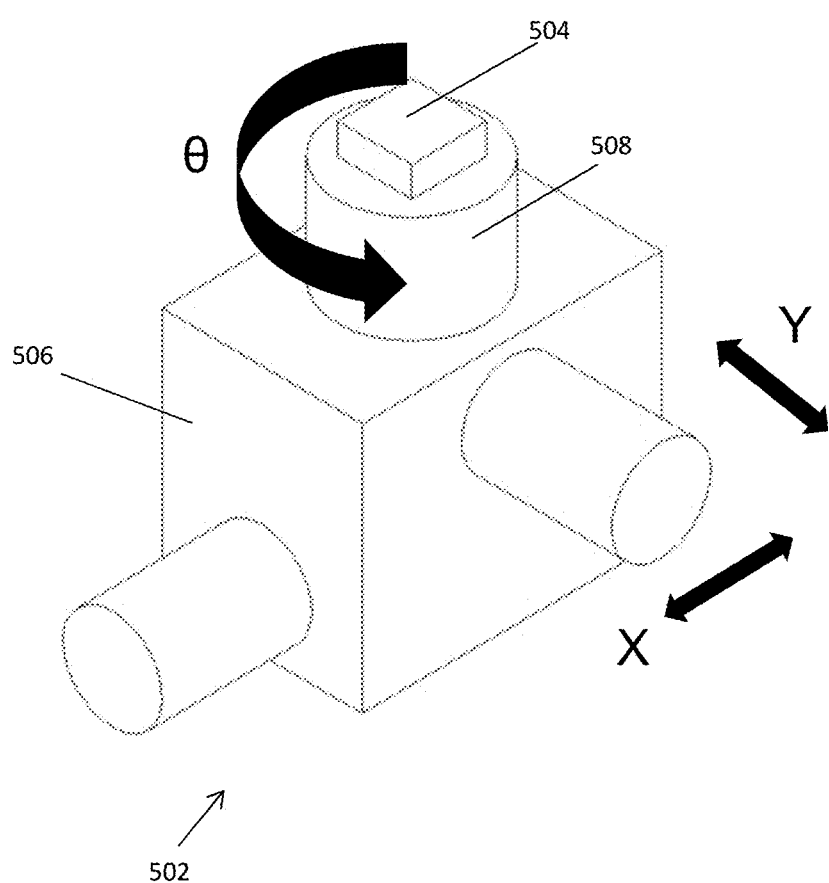
FIG. 5 shows a perspective view of an XYT table of the apparatus of FIG. 3.

The adjusting station 306 comprises an adjusting member in the form of an XYT table having movable elements and motors configured to drive the movable elements. FIG. 5 shows a perspective view of the XYT table 502 of the adjusting station 306. As shown in FIG. 5, the XYT table 502 comprises a first movable element 506 configured to move along two axes (X and Y axes) of a plane and a second movable element 508 configured to rotate in a θ direction parallel to the plane. Therefore, by placing the electronic device 504 on the second movable element 508, and driving the movable elements 506, 508 with the motors, the position of the electronic device 504 can be adjusted.

Figure 6A:
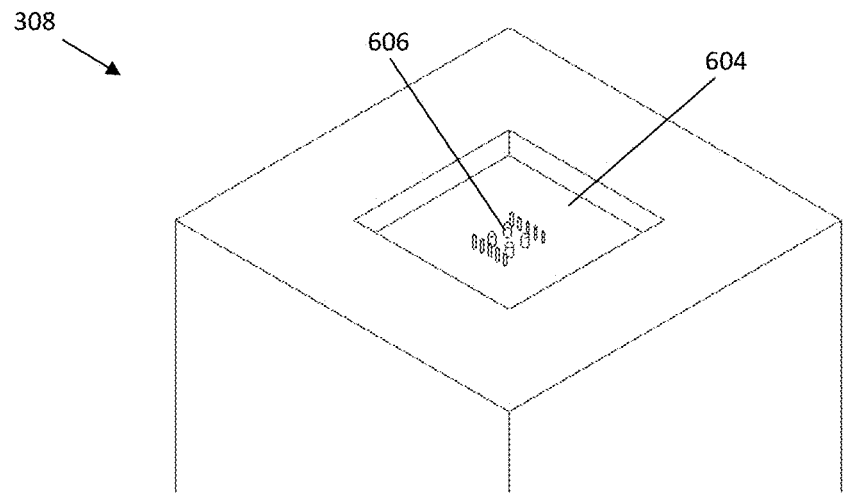
FIG. 6A shows a perspective view of a contactor station of the apparatus of FIG. 3
Figure 6B:
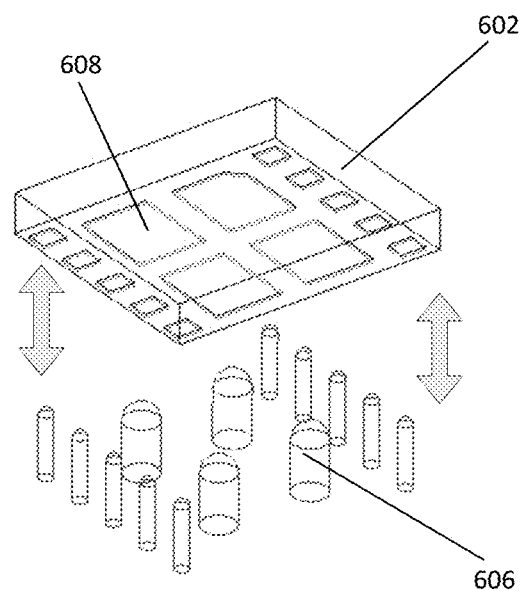
FIG. 6B shows a contact stamping process at the contactor station of FIG. 6A.

FIG. 6A shows a perspective view of the contactor station 308. The contactor station 308 comprises a socket 604 and probe pins 606 at the base of the socket 604. FIG. 6B shows a contact stamping process wherein the probe pins 606 are brought into contact with an electronic device 602. As shown in FIGS. 6A and 6B, the socket 604 is shaped to receive the electronic device 602 and the probe pins 606 are arranged so as to contact respective lead pads 608 of the electronic device 602 when the electronic device 602 is placed in the socket 604 and urged against the probe pins 606.

Figure 7:
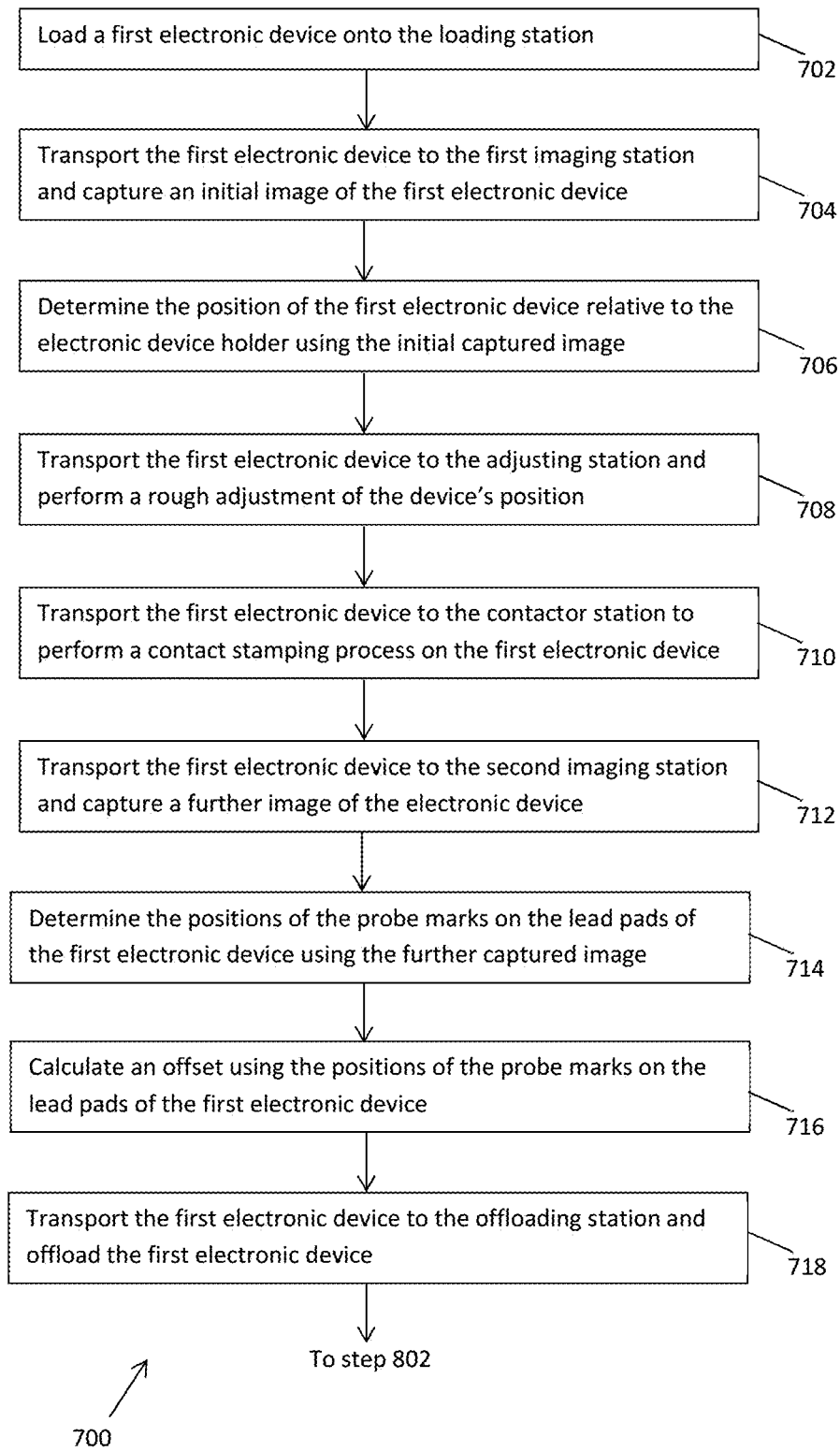
FIG. 7 shows a flow chart of a part of a method performed by the apparatus of FIG. 3.
Figure 8:
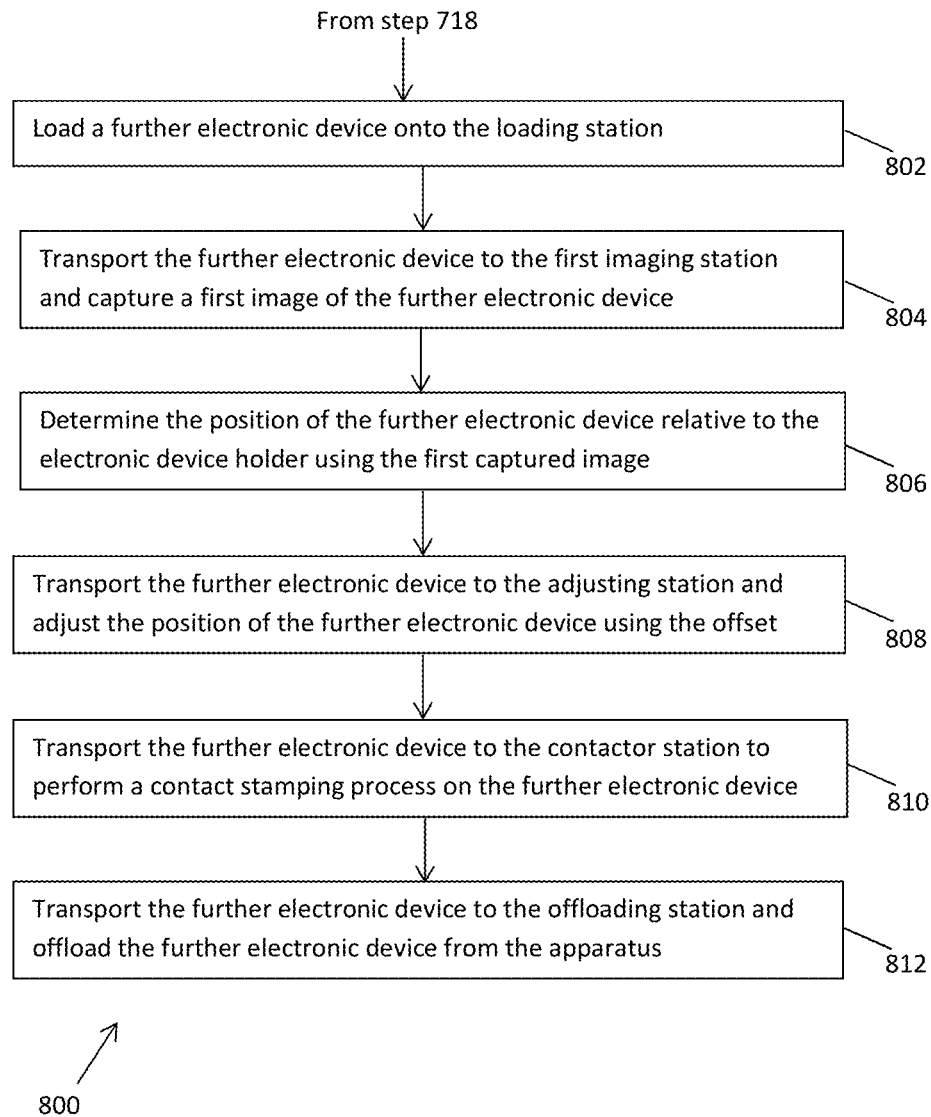
FIG. 8 shows a flow chart of another part of the method performed by the apparatus of FIG. 3.

In use, the apparatus 300 performs a method for aligning probe pins with respect to positions of electronic devices as shown in FIGS. 7-8.

In particular, the method comprises steps 702-718 (as shown in FIG. 7) to calculate an offset using a first electronic device, and steps 802-812 (as shown in FIG. 8) which uses the offset for testing a subsequent plurality of electronic devices. Steps 702-718 and 802-812 are described in detail below.

In step 702, a first electronic device is loaded onto the loading station 302.

In step 704, the first electronic device is transported by the transfer member 314 to the first imaging station 304 and an initial image of the first electronic device is captured by the uplook camera 402 at the first imaging station 304. In particular, an electronic device holder of the turret retrieves the first electronic device from the loading station 302 and as the main circular body of the turret rotates, the electronic device holder transports the first electronic device to the first imaging station 304. The electronic device holder then holds the first electronic device a distance above the camera 402 to capture the initial image.

In step 706, the position of the first electronic device relative to the electronic device holder is determined by the processing module using the initial captured image. This may be done by image processing techniques well known in the art.

In step 708, the first electronic device is transported to the adjusting station 306 and a rough adjustment of the device's position is performed. In particular, the main circular body of the turret rotates to move the electronic device holder carrying the first electronic device to the adjusting station 306. The first electronic device is placed onto the second movable element 508 of the XYT table 502 and its position relative to the electronic device holder is adjusted by driving the motors of the XYT table 502 to move the first and/or second movable elements 506, 508. This rough adjustment is based on the position of the first electronic device as determined in step 706.

In step 710, the first electronic device is transported to the contactor station 308 to perform a contact stamping process on the first electronic device (in other words, to contact the first electronic device with the probe pins 606). This is done by having the electronic device holder pick up the first electronic device from the XYT table 502 in its adjusted position and rotating the main circular body of the turret so as to move the electronic device holder to the contactor station 308. At the contactor station 308, while holding the first electronic device in its adjusted position, the electronic device holder urges the device against the probe pins 606 multiple times to form probe marks having a first level of depth on the lead pads of the first electronic device to increase the visibility of the probe marks.

In step 712, the first electronic device is transported to the second imaging station 310 and a further image of the electronic device is captured using the uplook camera 404 of the second imaging station 310. The electronic device holder moves the first electronic device away from the socket 604 and with the rotation of the main circular body of the turret, the electronic device holder moves from the contactor station 308 to the second imaging station 310. An image is captured by the uplook camera 404 while the first electronic device is held above and a distance away from the camera 404 by the electronic device holder.

In step 714, the positions of the probe marks on the lead pads of the first electronic device are determined by the processing module using the further captured image. Again, this may be performed by image processing techniques well known in the art.

Figure 9A:
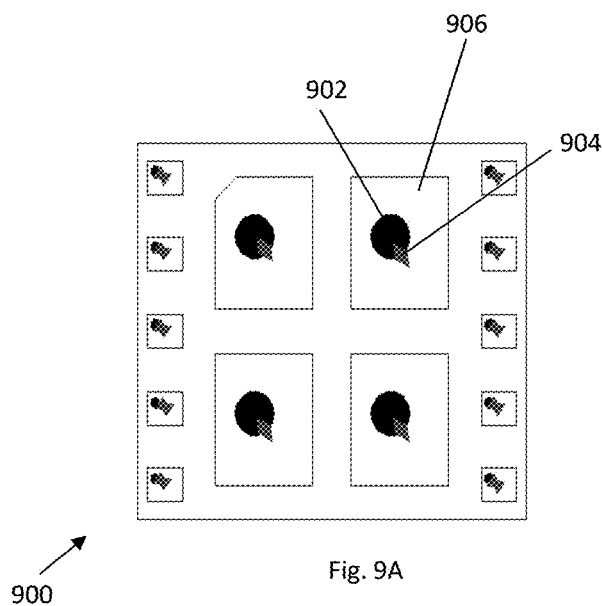
FIGS. 9A and 9B respectively show plan views of an electronic device with probe marks offset from and coinciding with centres of respective lead pads.
Figure 9B:
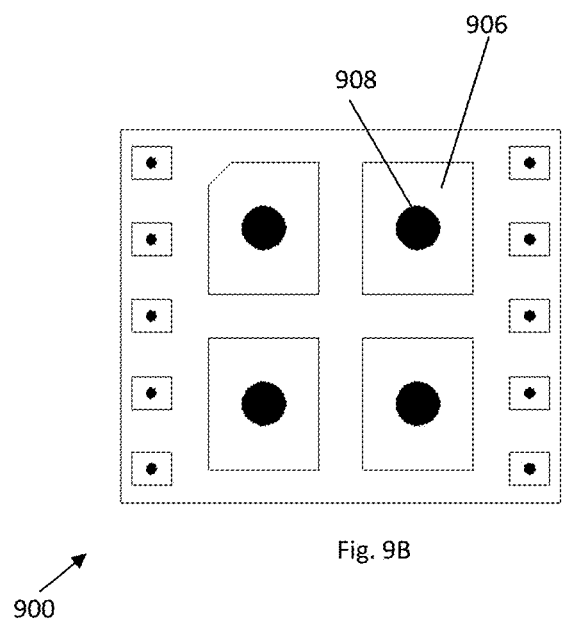

In step 716, an offset (comprising X, Y and θ components corresponding to the X, Y and θ directions as shown in FIG. 5) is calculated using the positions of the probe marks as determined in step 714. FIG. 9A shows an exemplary first electronic device 900 with probe marks 902 offset from the centres 904 of respective lead pads 906. Such probe marks 902 are formed on the first electronic device 900 in step 710. FIG. 9B shows the ideal situation in which probe marks 908 coincide with the centres of the respective lead pads 906. In step 716, the offset is calculated so as to achieve the ideal situation. In particular, the differences in the positions of the probe marks and the centres of the respective lead pads are first determined. Using these differences, the offset is then calculated such that if the first electronic device is further adjusted (i.e. further to the rough adjustment in step 708) in the X, Y and θ directions respectively equal to the X, Y and θ components of the offset prior to contacting the probe pins 606, the ideal situation will be achieved (i.e. the probe marks' positions will coincide with the centres of the respective lead pads).

In step 718, the first electronic device is transported to the offloading station 312 by the electronic device holder (again, via the rotation of the turret's main circular body) and is then offloaded from the apparatus 300.

Step 802 is performed next. Referring to FIG. 8, in step 802, a further electronic device is loaded onto the loading station 302.

In step 804, the further electronic device is transported to the first imaging station 304 and a first image of the further electronic device is captured by the uplook camera 402. This is performed in a similar manner as that described in step 704 above.

In step 806, the position of the further electronic device relative to the electronic device holder is determined by the processing module using the first captured image.

In step 808, the further electronic device is transported to the adjusting station 306 and the position of the further electronic device is adjusted. This is performed in a manner similar to that described in step 708 above, except that in step 808, the adjustment is done using not only the position of the further electronic device relative to the electronic device holder, but also the offset calculated in step 716. More specifically, in step 808, a device positioning difference is determined by calculating the difference between the further electronic device's position relative to the electronic device holder and the first electronic device's position relative to the electronic device holder (after the rough adjustment in step 708). Then, after the further electronic device is placed onto the second movable element 508, the processing module sends signals to the adjusting station 306 to drive the motors of the XYT table 502 to perform the following: (i) rotate the second movable element 508 by an amount equal to the sum of the θ component of the offset and the θ component of the device positioning difference, (ii) move the first movable element 506 along the X axis by an amount equal to the sum of the X component of the offset and the X component of the device positioning difference and (iii) move the first movable element 506 along the Y axis by an amount equal to the sum of the Y component of the offset and the Y component of the device positioning difference. This adjusts the position of the further electronic device with respect to the electronic device holder.

In step 810, the further electronic device is transported to the contactor station 308 to perform a testing process on the further electronic device. This is done in a similar manner as that described in step 710, except that the further electronic device needs to be urged against the probe pins 606 only once, thereby forming probe marks of a second level of depth less than the first level of depth.

In step 812, the further electronic device is transported to the offloading station 312 and is then offloaded from the apparatus 300.

Steps 802-812 are then repeated on a further plurality of electronic devices. In particular, the apparatus 300 is configured to perform steps 802-812 on a predetermined number of subsequent electronic devices (after the first electronic device). Thereafter, steps 702-718 are repeated on another electronic device to obtain another offset (which may or may not be the same as the previous offset) and using this offset, steps 802-812 are performed on yet another predetermined number of subsequent electronic devices.

Figure 10:
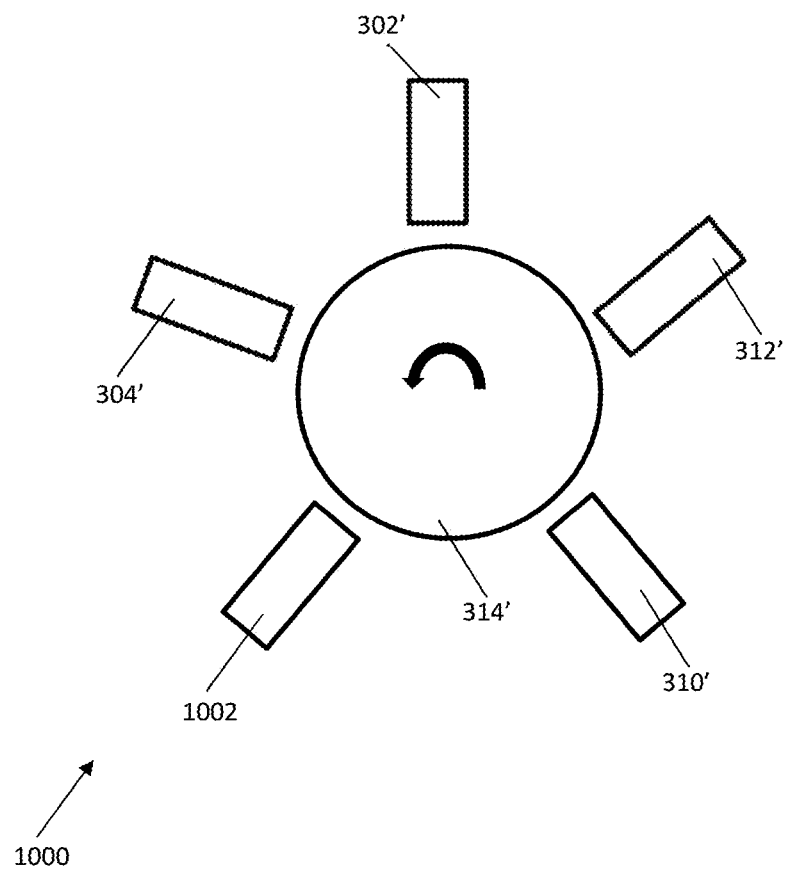
FIG. 10 shows an apparatus for aligning probe pins with respect to positions of electronic devices according to a second embodiment of the present invention.

FIG. 10 shows an apparatus 1000 for aligning probe pins with respect to positions of electronic devices according to a second embodiment of the present invention. The apparatus 1000 is similar to the apparatus 300 and thus, the same parts will have the same reference numerals with the addition of prime.

As shown in FIG. 10, the apparatus 1000 also comprises a loading station 302', a first imaging station 304', a second imaging station 310', an offloading station 312' and a transfer member 314'. However, instead of having separate stations 306, 308 for adjusting the positions of the electronic devices and for contacting the devices with the probe pins 606, these two stations are integrated to form a single adjusting and contactor station 1002 in the apparatus 1000. More specifically, this single adjusting and contactor station 1002 comprises the probe pins and is configured to adjust positions of the probe pins.

Figure 11A:
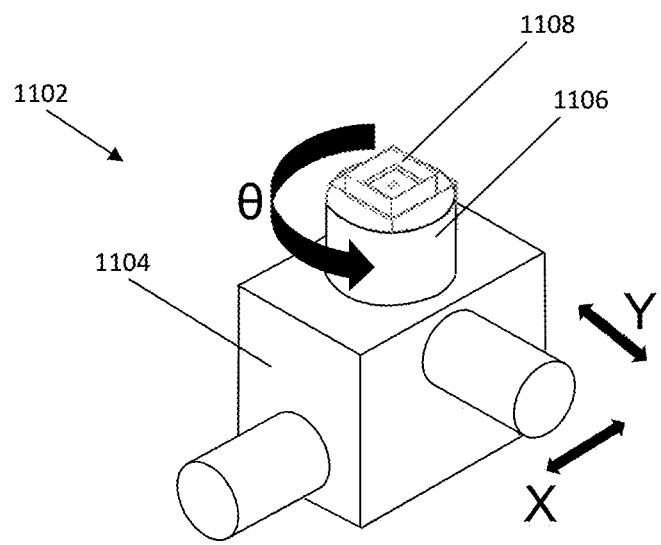
FIG. 11A shows a perspective view of an XYT table of the apparatus of FIG. 10
Figure 11B:
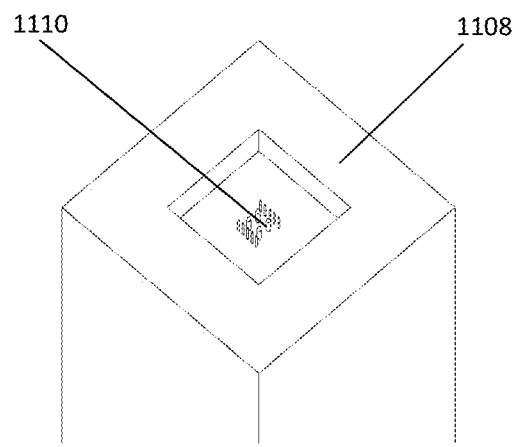
FIG. 11B shows an enlarged view of a part of the XYT table of FIG. 11A.

FIG. 11A shows a perspective view of an XYT table 1102 of the single adjusting and contactor station 1002. The XYT table 1102 comprises first and second movable elements 1104, 1106 similar to the first and second movable elements 506, 508 of the apparatus 300. The XYT table 1102 also comprises a socket 1108 (similar to the socket 604 of the apparatus 300) integrated with the second movable element 1106. FIG. 11B shows an enlarged view of the socket 1108. As shown in FIG. 11B, the socket 1108 comprises a plurality of probe pins 1110 on its base.

Figure 12:
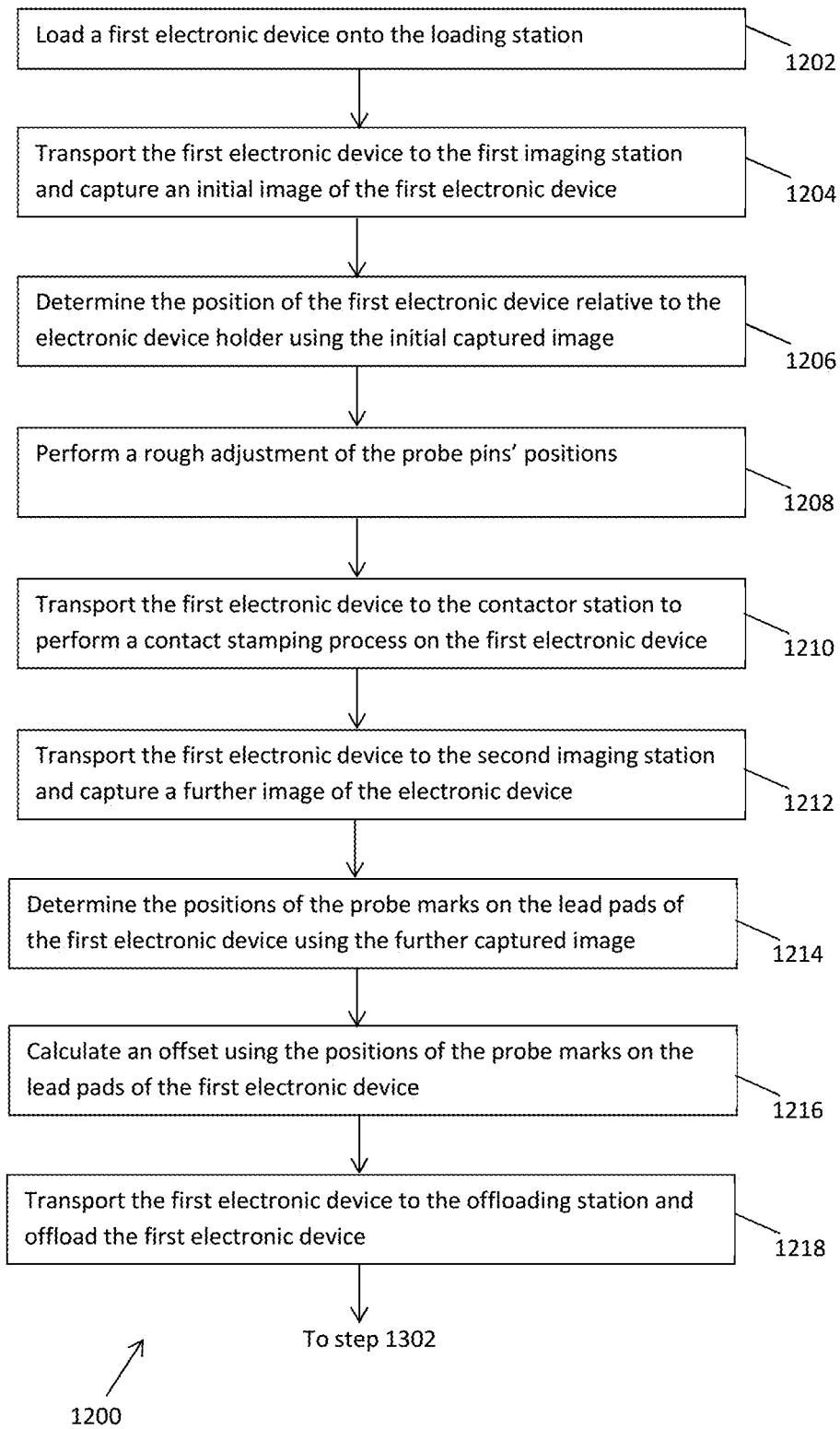
FIG. 12 shows a flow chart of a part of a method performed by the apparatus of FIG. 10.
Figure 13:
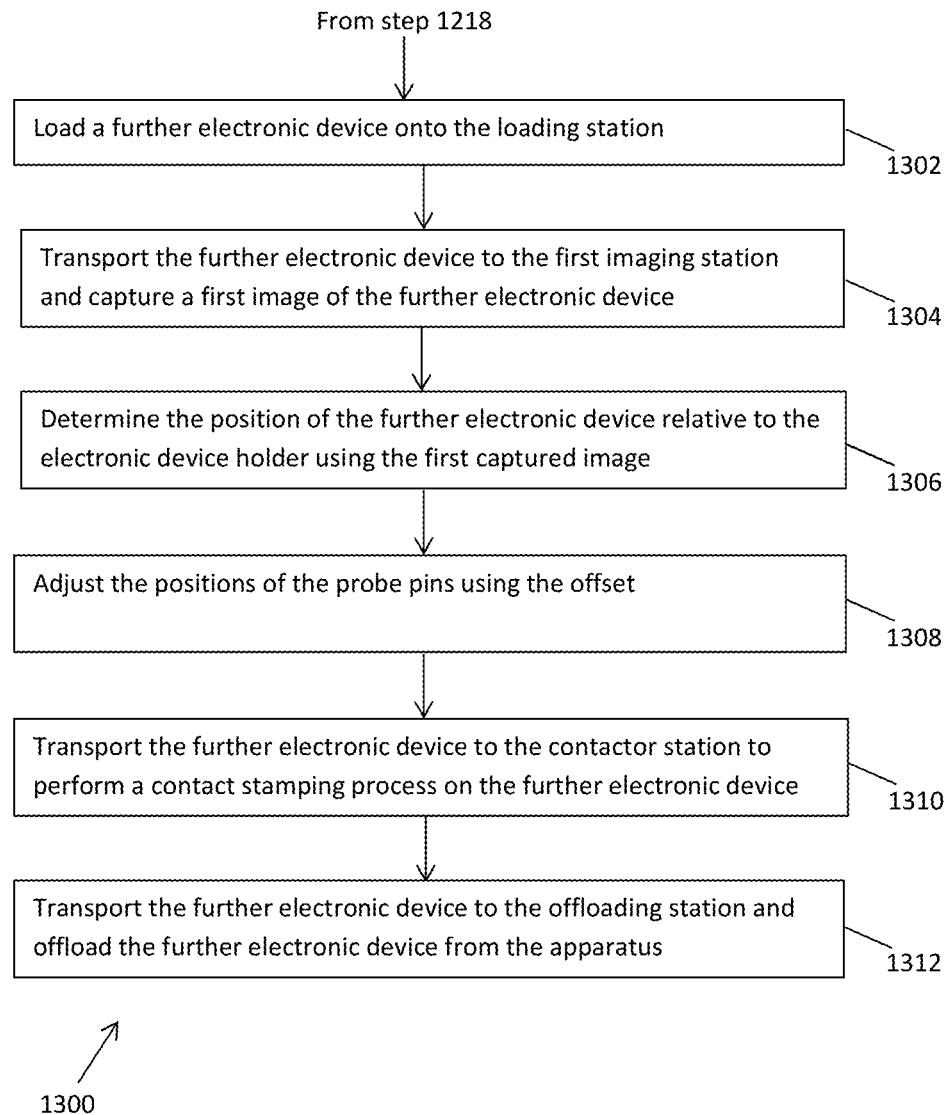
FIG. 13 shows a flow chart of another part of the method performed by the apparatus of FIG. 10.

In use, the apparatus 1000 performs a method as shown in FIGS. 12-13 for aligning probe pins with respect to positions of electronic devices. The method performed by the apparatus 1000 is similar to that performed by the apparatus 300 shown in FIGS. 7-8.

However, instead of step 708 of performing a rough adjustment of the first electronic device's position, the apparatus 1000 performs step 1208 of performing a rough adjustment of the positions of the probe pins 1110. This is done by moving the first and/or second movable elements 1104, 1106 of the XYT table 1102.

Also, the offset in step 1216 for the apparatus 1000 is calculated differently from that in step 716 for the apparatus 300. More specifically, in step 1216, the offset is calculated such that if prior to the testing process, the probe pins are further adjusted (i.e. further to the aforementioned rough adjustment) in the X, Y and θ directions by amounts respectively equal to the X, Y and θ components of the offset, the probe marks' positions will coincide with the centres of the respective lead pads of the first electronic device.

Further, instead of step 808 of adjusting the further electronic device's position using the offset, the apparatus 1000 performs step 1308 of adjusting the probe pins' positions using the offset. More specifically, in step 1308, a device positioning difference (being the difference between the further electronic device's position relative to the electronic device holder and the first electronic device's position relative to the electronic device holder) is calculated. Then, the processing module sends signals to the single adjusting and contactor station 1002 to drive the motors of the XYT table 1102 to perform the following: (i) rotate the second movable element 1106 by an amount equal to the sum of the θ component of the offset and the θ component of the device positioning difference, (ii) move the first movable element 1104 along the X axis by an amount equal to the sum of the X component of the offset and the X component of the device positioning difference and (iii) move the first movable element 1104 along the Y axis by an amount equal to the sum of the Y component of the offset and the Y component of the device positioning difference. This adjusts the positions of the probe pins. Note that when step 1308 is first performed, the probe pins are in the position after performing the rough adjustment in step 1208 and the probe pins are moved back to this position after each iteration of steps 1302-1312.

For the apparatus 1000, the position of each electronic device relative to the electronic device holder is fixed at the point the electronic device holder retrieves the device at the loading station 302'. Thus, adjusting the positions of the probe pins 1110 adjusts the relative positions between the electronic devices and the probe pins 1110.

Figure 14:
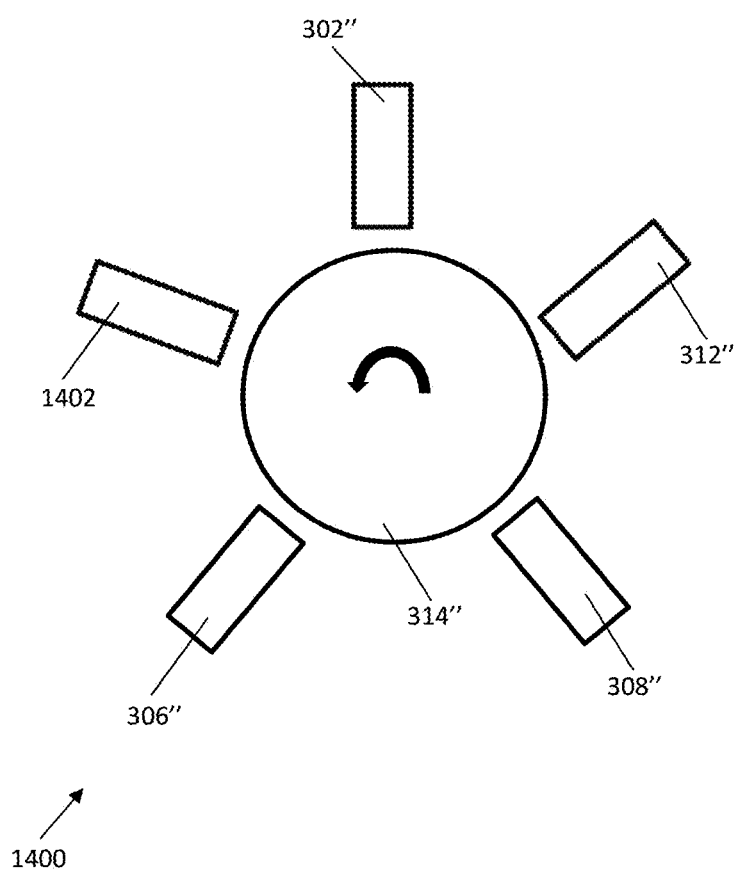
FIG. 14 shows an apparatus for aligning probe pins with respect to positions of electronic devices according to a third embodiment of the present invention.

FIG. 14 shows an apparatus 1400 for aligning probe pins with respect to positions of electronic devices according to a third embodiment of the present invention. The apparatus 1400 is similar to the apparatus 300 and thus, the same parts will have the same reference numerals with the addition of double prime.

To elaborate, the apparatus 1400 also comprises a loading station 302", an adjusting station 306", a contactor station 308", an offloading station 312" and a transfer member 314". However, instead of having two imaging stations 304, 310, the apparatus 1400 comprises only a single imaging station 1402 configured to capture images of the electronic devices.

In use, the apparatus 1400 performs a method, similar to that performed by the apparatus 300, for aligning probe pins with respect to positions of electronic devices. However, the initial and further images of the first electronic device are both captured at the single imaging station 1402 instead of at separate imaging stations 304, 310. This involves rotating the main circular body of the turret in a direction opposite to the direction from the imaging station 1402 to the contactor station 308" (i.e. clockwise in FIG. 14) to move the first electronic device back to the imaging station 1402 after the contact stamping process after turning anti-clockwise to bring the first electronic device to the contactor station 308".

Figure 15:
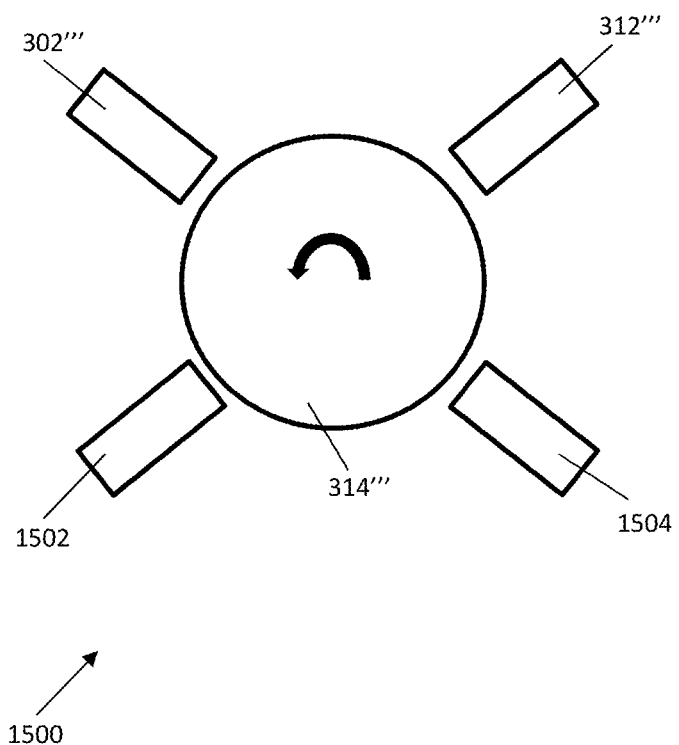
FIG. 15 shows an apparatus for aligning probe pins with respect to positions of electronic devices according to a fourth embodiment of the present invention.

FIG. 15 shows an apparatus 1500 for aligning probe pins with respect to positions of electronic devices according to a fourth embodiment of the present invention. The apparatus 1500 is similar to the apparatus 300 and thus, the same parts will have the same reference numerals with the addition of triple prime.

To elaborate, the apparatus 1500 also comprises a loading station 302''', an offloading station 312''' and a transfer member 314''. However, similar to apparatus 1000, instead of having separate adjusting and contactor stations 306, 308, the apparatus 1500 comprises a single adjusting and contactor station 1504. Also, similar to the apparatus 1400, instead of having two imaging stations 304, 310, the apparatus 1500 comprises only a single imaging station 1502 configured to capture images of the electronic devices.

In use, the apparatus 1500 performs a method similar to that performed by the apparatus 1000 as described above, except that the apparatus 1500 captures both the initial and further images of the first electronic device at the single imaging station 1502 (in a manner similar to that described above for apparatus 1400).

Various modifications will be apparent to those skilled in the art.

For example, the various apparatus 300, 1000, 1400, 1500 need not be configured to adjust the positions of the electronic devices or the probe pins in three directions X, Y, θ. Instead, the said apparatus 300, 1000, 1400, 1500 may be configured to adjust the positions of the electronic devices or the probe pins in only two directions X, Y. In this case, instead of the XYT table 502, 1002, the adjusting member may be in the form of an XY table having only a single movable element similar to the first movable elements 506, 1104 of the XYT tables 502, 1002.

Also, the positions of the electronic devices or the probe pins may be adjusted by moving the movable elements of the adjusting member manually. This may be in place of or in addition to the adjustment of the positions by driving the motors of the XYT tables 502, 1002. In this case, the adjusting station may further comprise a gauge configured to facilitate the manual adjustment so as to improve the accuracy of the adjustment.

In addition, instead of urging the first electronic device multiple times against the probe pins so as to form deeper probe marks, a greater urging force may be used to achieve a similar effect of increasing the visibility of the probe marks.

Further, it is not necessary to include the step 708, 1208 of performing a rough adjustment of the first electronic device or the probe pins prior to the contact stamping process on the first electronic device. In this case, the offset will be calculated and the adjustment of the device's position or probe pins' positions will be subsequently performed without taking into consideration any rough adjustment.

Although not preferred, it is also not necessary to perform the step 704, 1204 of capturing an initial image of the first electronic device and the step 706, 1206 of determining the position of the first electronic device relative to the electronic device holder. Similarly, it is not necessary to perform the step 804, 1304 of capturing a first image of each further electronic device and the step 806, 1306 of determining the position of the further electronic device relative to the electronic device holder. Instead, it may be assumed that the electronic device holder picks up an electronic device in the same position each time, so the position of each further electronic device relative to the electronic device holder is the same as the position of the first electronic device relative to the electronic device holder. With this assumption, the device positioning difference need not be calculated in step 808, 1308 and the position of each further electronic device or the positions of the probe pins can be adjusted by using only the offset. In fact, with such an assumption, the positions of the probe pins may be adjusted only once using the offset before step 802, 1302 is carried out for the first time.

The invention claimed is:

1. A method for aligning probe pins with respect to positions of electronic devices, the method comprising:
   conducting contact stamping on a first electronic device with the probe pins multiple times repeatedly at a same position of the probe pins relative to the first electronic device to form deeper first probe marks on lead pads of the first electronic device;
   capturing an image of the first electronic device;
   determining positions of the first probe marks on the first electronic device using the captured image;
   calculating an offset using the positions of the first probe marks;
   adjusting relative positions between a subsequent plurality of electronic devices and the probe pins using the offset; and
   contacting lead pads of the subsequent plurality of electronic devices with the probe pins for testing said electronic devices, the contacting of the lead pads of the subsequent plurality of electronic devices with the probe pins forming second probe marks, wherein the first probe marks have a different characteristic than the second probe marks, and wherein the different characteristic is that the first probe marks formed during the contact stamping are configured to have greater visibility as compared with the second probe marks.

2. The method according to claim 1, further comprising the following steps prior to the step of conducting contact stamping on the first electronic device with the probe pins:
   retrieving the first electronic device with a handling member; and
   determining a position of the first electronic device relative to the handling member.

3. The method according to claim 2, wherein the step of adjusting the relative positions between the subsequent plurality of electronic devices and the probe pins using the offset comprises:
   retrieving a subsequent electronic device with the handling member;
   determining a position of the subsequent electronic device relative to the handling member;
   calculating a difference between the position of the subsequent electronic device relative to the handling member and the position of the first electronic device relative to the handling member; and
   adjusting the relative position between the subsequent electronic device and the probe pins using the offset and the calculated difference.

4. The method according to claim 3, wherein the step of adjusting the relative position between the subsequent electronic device and the probe pins is conducted by an adjusting station that is integrated with a contactor station for testing the electronic device such that the adjusting station and the contactor station form a single station.

5. The method according to claim 4, wherein the step of adjusting the relative positions between the subsequent plurality of electronic devices and the probe pins using the offset further comprises the step of adjusting positions of the probe pins using the single station.

6. The method according to claim 3, wherein the step of adjusting the relative position between the subsequent electronic device and the probe pins is conducted by an adjusting station that is separate from a contactor station for testing the electronic device.

7. The method according to claim 6, wherein the step of adjusting the relative positions between the subsequent plurality of electronic devices and the probe pins using the offset is performed by the adjusting station with respect to the handling member prior to the contacting of the lead pads of the subsequent plurality of electronic devices with the probe pins.

8. The method according to claim 2, wherein the step of determining the position of the first electronic device relative to the handling member comprises capturing an image of the first electronic device and determining the position using the captured image.

9. The method according to claim 8, wherein the step of capturing the image of the first electronic device prior to the step of conducting contact stamping on the first electronic device with the probe pins and the step of capturing the image of the first electronic device after the step of conducting contact stamping on the first electronic device with the probe pins are conducted using a single imaging station.

10. The method according to claim 8, wherein the step of capturing the image of the first electronic device prior to the step of conducting contact stamping on the first electronic device with the probe pins is conducted using one imaging station and the step of capturing the image of the first electronic device after the step of conducting contact stamping on the first electronic device with the probe pins is conducted using another imaging station.

11. The method according to claim 1, further comprising adjusting a relative position between the first electronic device and the probe pins prior to the step of conducting contact stamping on the first electronic device with the probe pins.

12. The method according to claim 1, wherein the step of calculating the offset comprises determining differences in the positions of the first probe marks and centres of respective lead pads of the first electronic device the first probe marks are formed on.

13. The method according to claim 1, wherein the first probe marks are formed to have a first level of depth and the second probe marks have a second level of depth, the second level of depth being less than the first level of depth.

14. The method according to claim 1, wherein the step of adjusting the relative positions between the subsequent plurality of electronic devices and the probe pins using the offset is conducted manually using an adjusting station including a gauge configured to facilitate manual adjustment of positions of the electronic devices or the probe pins.

15. An apparatus for aligning probe pins with respect to positions of electronic devices, the apparatus comprising:
a contactor station configured to conduct contact stamping on a first electronic device with the probe pins multiple times repeatedly at a same position of the probe pins relative to the first electronic device to form deeper first probe marks on lead pads of the first electronic device and to contact lead pads of a subsequent plurality of electronic devices with the probe pins to conduct testing of the subsequent plurality of electronic devices with the probe pins, which testing forms second probe marks, the first probe marks having a different characteristic than the second probe marks, and the different characteristic is that the first probe marks formed during the contact stamping are configured to have greater visibility as compared with the second probe marks;
an imaging station configured to capture an image of the first electronic device after the contact stamping of the first electronic device with the probe pins;
a processing module configured to determine positions of the first probe marks on the first electronic device using the captured image and to calculate an offset using the positions of the first probe marks; and
an adjusting station configured for adjusting relative positions between the subsequent plurality of electronic devices and the probe pins using the offset prior to the testing of the subsequent plurality of electronic devices with the probe pins.

* * * * *